(12) United States Patent
Osann, Jr. et al.

(10) Patent No.: US 6,694,491 B1
(45) Date of Patent: Feb. 17, 2004

(54) PROGRAMMABLE LOGIC ARRAY EMBEDDED IN MASK-PROGRAMMED ASIC

(75) Inventors: Robert Osann, Jr., Los Altos, CA (US); Shafy Eltoukhy, Los Gatos, CA (US); Shridhar Mukund, San Jose, CA (US); Lyle Smith, Menlo Park, CA (US)

(73) Assignee: Lightspeed Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/512,783

(22) Filed: Feb. 25, 2000

(51) Int. Cl.[7] .............................................. G06F 17/50
(52) U.S. Cl. ........................................ 716/2; 365/154
(58) Field of Search ........................... 716/2, 5, 16, 17, 716/1; 326/39; 365/154

(56) References Cited

U.S. PATENT DOCUMENTS

| | | |
|---|---|---|
| 5,425,036 A | 6/1995 | Liu et al. |
| 5,426,738 A | 6/1995 | Hsieh et al. |
| 5,426,769 A | 6/1995 | Pawloski |
| 5,530,378 A | 6/1996 | Kucharewski, Jr. et al. |
| 5,566,127 A | 10/1996 | Hoshizaki .............. 365/230.06 |
| 5,572,148 A | 11/1996 | Lytle et al. .................... 326/41 |

(List continued on next page.)

FOREIGN PATENT DOCUMENTS

| | | | |
|---|---|---|---|
| EP | 0 433 850 A2 | 6/1991 | |
| EP | 0905906 A2 | 3/1999 | .................. 19/173 |
| WO | WO 90/13982 | 11/1990 | |
| WO | WO 98/38741 | 9/1998 | .................. 19/177 |
| WO | WO 99/56394 | 11/1999 | .................. 19/177 |
| WO | WO 0163766 A2 | 8/2001 | |

OTHER PUBLICATIONS

Rettelbusch L et al: "Moglichkeiten Programmierbarer Matrizen" Nachrichtentechnik Elektronik, Veb Verlag Technik. Berlin. DE, vol. 39, no 8, 1989, pp. 307–310, XP000068187, ISSN: 0323–4657.

Sinha S et al: "Binary and Multi–valued SPFD–Based Wire Removal in PLA Networks" Computer Design, 2000. Proceedings 2000 International Conference, Austin, TX, USA Sep. 17–20, 2000, Los Almitos, Ca, USA, IEEE Comput. Soc, US, Sep. 17, 2000, pp. 494–503, XP010520142, ISBN: 0–7695–0801–4.

Smith, Michael John Sebastian, Application–Specific Integrated Circuits, Addison–Wesley, p. 16.

Matsumoto, C., LSI's SoC formula: FPGA plus ASICS, Electronic Times, 1999, n 1072, PG 1, Aug. 2, 1999.

Souza, C., Programmable core opens door to SOC market, Electronic Buyers News, 1999, N 1171, PG5, Aug. 2, 1999.

LSI Logic to pry open market with FPGA core, Electronic News,Jul. 20, 1999.

*Primary Examiner*—Matthew Smith
*Assistant Examiner*—Thuan Do
(74) *Attorney, Agent, or Firm*—Sarah Barone Schwartz; Quirk & Tratos

(57) ABSTRACT

In accordance with the invention, a method for customizing a one-time configurable integrated circuit to include a multi-time configurable structure is disclosed. Such a method includes, in one embodiment receiving a description of circuit functionality from a user for implementation in the one-time configurable device, where the functionality includes a portion that is designated by the user to be reconfigurable. A method in accordance with an embodiment of the invention then models a reconfigurable structure that has enough capacity to accommodate the designated functionality. Optionally, some embodiments of the invention add in more capacity than is required to implement the designated functionality to allow for future reprogramming. The method then embeds the reconfigurable structure in the one-time configurable device. In certain embodiments, the one-time configurable device can be a mask-programmed MBA, gate array, or standard cell, while the reconfigurable structure is a PLA or modified PLA.

27 Claims, 13 Drawing Sheets

U.S. PATENT DOCUMENTS

| | | | |
|---|---|---|---|
| 5,646,545 A | 7/1997 | Trimberger et al. | 326/41 |
| 5,670,897 A | 9/1997 | Kean | 326/41 |
| 5,708,597 A | 1/1998 | Kelem | 365/230.03 |
| 5,715,197 A | 2/1998 | Nance et al. | 365/189.02 |
| 5,732,407 A | 3/1998 | Mason et al. | 711/104 |
| 5,744,980 A | 4/1998 | McGowan et al. | 326/40 |
| 5,796,269 A | 8/1998 | New | 326/40 |
| 5,801,547 A | 9/1998 | Kean | 326/40 |
| 5,809,281 A | 9/1998 | Steele et al. | 395/497.01 |
| 5,844,854 A | 12/1998 | Lee | 361/230.01 |
| 5,861,761 A | 1/1999 | Kean | 326/41 |
| 5,883,852 A | 3/1999 | Ghia et al. | 365/230.05 |
| 5,886,538 A | 3/1999 | New | 326/40 |
| 5,943,488 A | 8/1999 | Raza | |
| 6,028,787 A * | 2/2000 | Sansbury et al. | 365/154 |
| 6,071,314 A | 6/2000 | Baxter et al. | |
| 6,075,935 A | 6/2000 | Ussery et al. | |
| 6,167,559 A | 12/2000 | Furtek et al. | |
| 6,178,541 B1 | 1/2001 | Joly et al. | |
| 6,216,258 B1 * | 4/2001 | Mohan et al. | 716/17 |
| 6,260,182 B1 * | 7/2001 | Mohan et al. | 716/12 |
| 6,263,484 B1 | 7/2001 | Yang | |
| 6,301,696 B1 * | 10/2001 | Lien et al. | 716/2 |
| 2002/0010903 A1 | 1/2002 | Osann, Jr. et al. | |

* cited by examiner

US 6,694,491 B1

PROGRAMMABLE LOGIC ARRAY EMBEDDED IN MASK-PROGRAMMED ASIC

FIELD OF INVENTION

This invention generally relates to Application Specific Integrated Circuits (ASICs), and particularly to Programmable Logic Arrays (PLAs) incorporated into non-reprogrammable ASIC devices.

BACKGROUND

Application Specific Integrated Circuits (ASICS) have become widespread in the semiconductor industry. ASICs are generally integrated circuits that are customizable to implement a circuit specified by a design engineer or other user (a "user-defined" or "user-specified" circuit).

ASICs can be divided into two groups: (1) those that are "multi-time configurable" or "reconfigurable" (i.e., they can be programmed with data and reprogrammed) and (2) those that are only "one-time configurable" or "non-reconfigurable." Multi-time configurable devices include Programmable Logic Devices (PLDs) and FPGAs. One-time configurable devices include some gate arrays and module-based arrays (MBAs). A general discussion of each technology will be useful.

Multi-Time Configurable Devices

Generally, most PLDs are based on a PLA structure where a function is expressed in product terms and sum terms to be implemented. Each product term is generated by a gate that can be programmed to form the AND of any subset of the inputs and their complements. Subsets of the product terms can be summed in a set of programmable OR gates. PLAs are constructed in the form of arrays, with the input lines being orthogonal to the product lines, as shown in the generalized circuit diagram of FIG. 1. FIG. 1 shows one type of PLA known as a PAL. In FIG. 1, PAL 100 includes inputs 106, A, B, and C, where each input and its complement is input into programmable AND array 102 on lines 104. Product term lines 110 are formed orthogonal to lines 104. When the intersection between the input term and a product term line is programmed, then "AND terms" or "product terms" 108 are formed. The product terms 108 are then fed into OR gates 112, forming "sum terms" 114.

Product-terms are often implemented with a wired-OR mechanism, where multiple programmable transistors 116 are connected to the product-term line 110 and a pull-up 118 is used, as shown in the generalized circuit diagram of FIG. 2. Although the pull-up 118 is shown as a resistor in FIG. 2, frequently a passive pull-up is implemented with a biased P-channel transistor instead.

A second type of PLA structure (sometimes referred to as a "Full PLA") is shown in FIG. 3, having both a programmable AND array 102 and a programmable OR array 111. In other words, both product terms and sum terms can be programmed using the device of FIG. 3. Relative to the device of FIG. 1, the device of FIG. 3 sacrifices some speed, but has greater programming flexibility and is better for implementing state machines. As well, unlike the FIG. 1 device, in the FIG. 3 device, product terms can be shared among all OR terms. Thus, the device of FIG. 3 can implement any set of combinational logic limited only by the number of inputs, outputs, and product terms.

Flexibility of PLA structures, including those of FIGS. 1 and 3, can be further enhanced by adding flip-flops to one or more of the outputs to create general-purpose sequential circuits, often referred to as "sequencers." A generalized block diagram of such a device is shown in FIG. 4. In FIG. 4, the sum terms 114 output from the OR array 111 can feed directly to output pins 506 or to inputs of a flip-flop 508. The flip-flop outputs can be fed back either to the AND array 102 or directly to output pins 506. Product terms 108 can also be fed back into the AND array, often through an inverter 510 to create "expander" terms (such feedback often creates what is known as a NAND-NAND array or a NOR-NOR array). Not all sequencers have all of these options available. Nonetheless, such options are ideal for state machines.

Each of the conventional PLA structures described in FIGS. 1–4 is usually a discrete device and is programmable and reprogrammable by the user either using a specialized programming device or in-system as is understood in the art. As should be understood in the art from FIGS. 1–4, there are numerous types of PLAs available and those described are exemplary only.

One-Time Configurable Devices

The second category of ASIC mentioned is a one-time configurable ASIC, frequently gate arrays, MBAs, or standard cells. Typically, these one-time configurable devices are configured (or customized) by "mask-programming"— i.e., these devices are customized once using various mask and etch steps to form interconnections dictated by a user-defined circuit. Once configured, these mask-programmed devices are not reconfigurable.

An example MBA is shown in the generalized block diagram of FIG. 5, and is composed of an array 702 of function blocks 704. Each function block 704 in an MBA usually includes a predefined circuit that is often identical in all function blocks. To customize the device, mask-programming techniques are used to interconnect the function blocks in a manner that creates a user-defined circuit. In other words, to configure the device, mask and etch techniques are used to form the conductors that interconnect the blocks 704 and/or interconnect active devices within the blocks 704.

Gate arrays are known in the art and are similar in many respects to MBAs, except they are frequently composed of a "sea of gates"—prefabricated transistors that are (for the most part) unconnected to one another. These gate arrays are also configured using mask and etch techniques to interconnect the active devices and thereby form a user-defined circuit.

More specifically, as shown in FIG. 6, each MBA (or standard cell or gate array) is formed from many layers that usually include an active layer 810 (where active devices such as transistors are formed) and several metal layers (M1–M4) 820, 830, 840, and 850 separated by insulation layers 815, 825, 835, 845. Frequently, an MBA device will be prefabricated up through a particular metal layer, say M2. Then customizing will be done in metal layers above, say M3 and M4. Although four metal layers are shown, MBAs can contain more or fewer metal layers, and four is used as exemplary only. As well, customization can be done using any number of metal layers.

Another type of mask-programmed device is a "standard cell." A standard cell is similar to an MBA, but instead of predefined function blocks, it includes custom cells that are optimized for performing a respective designated function. In other words, compared to MBA function blocks, the custom cells of a standard cell device have adjusted transistor size and placement and have eliminated extraneous devices. Thus, standard cells are customized in all the layers shown in FIG. 6, including active layers 810. Both MBAs and standard cells, however, often use libraries to store available potential logic functions that can be implemented by function blocks (in the case of MBAs) or a custom cell (in the case of standard cells) for easier configuration. Gate arrays can also utilize similar libraries. Once the customizing metal layers have been designed and implemented, the mask-programmed device (e.g., MBA or standard cell) is said to have been configured—but it cannot be reconfigured. As a result, designers of mask-programmed ASICs typically implement high-speed logic functions, including state machines and control logic, with conventional non-reconfigurable ASIC gates. Still, in many instances, when a mask-programmed device is configured, many parts of the implemented circuit are not fully verified. Moreover, during the development process, changes often need to occur in certain parts of the circuit, such as the control logic. Therefore, frequently portions of the circuit that are to be reconfigurable or may need to be changed are typically separately implemented in a separate PLD device. Thus, it is desirable to maintain some level of reconfigurability in at least part of the circuit, thereby minimizing the use of multiple ICs.

SUMMARY

In accordance with the invention, a method for customizing a one-time configurable integrated circuit to include a multi-time configurable structure is disclosed. Such a method includes, in one embodiment, receiving a description of circuit functionality from a user for implementation in the one-time configurable device, where the functionality includes a portion that is designated by the user to be reconfigurable. A method in accordance with an embodiment of the invention then models a reconfigurable structure that has enough capacity to accommodate the designated functionality. Optionally, some embodiments of the invention add in more capacity than is required to implement the designated functionality to allow for future reprogramming. The method then embeds the reconfigurable structure in the one-time configurable device. In certain embodiments, the one-time configurable device can be a mask-programmed MBA, gate array, or standard cell, while the reconfigurable structure is a PLA or modified PLA.

The ability to reconfigure a portion of a one-time configurable device is especially useful where time-to-market and flexibility are particularly important. Such reconfigurability is also useful for high-risk circuits and state machine control. For instance, if a designer using a mask-programmed device is unsure of part of his/her design, the designer may want the ability to reconfigure a portion of that design without having to resort to multiple chips. In particular, because most circuit changes in a user-defined circuit occur in the control logic, a PLA structure incorporated into a mask-programmed device in accordance with the invention is particularly useful for implementing a circuit's control logic.

BRIEF DESCRIPTION OF THE DRAWINGS

The present invention is described with respect to particular exemplary embodiments thereof and reference is accordingly made to the drawings in which.

DETAILED DESCRIPTION

In accordance with the invention, a multi-time configurable structure such as a reconfigurable PLA structure is incorporated into a one-time configurable ASIC. In accordance with the invention, the following generalized steps can be performed to obtain reconfigurability. First, the designer (user) defines the planned functionality for the ASIC as a whole, including the functionality that the designer believes will be required for the particular reconfigurable logic block, such as a state machine. The designer designates that portion of the functionality that is to be reconfigurable, and software next takes the specified description of the designated functionality to model a PLA structure suitable for implementation of that reconfigurable logic. The designer and/or software then adds a selected number of AND terms, OR terms, nonregistered outputs, registered outputs, state-bits, etc., to allow for expansion or modification of the functionality in the event of later reprogramming. This modeled PLA structure (with added capacity) is then incorporated into the rest of the ASIC design.

Figure 7:
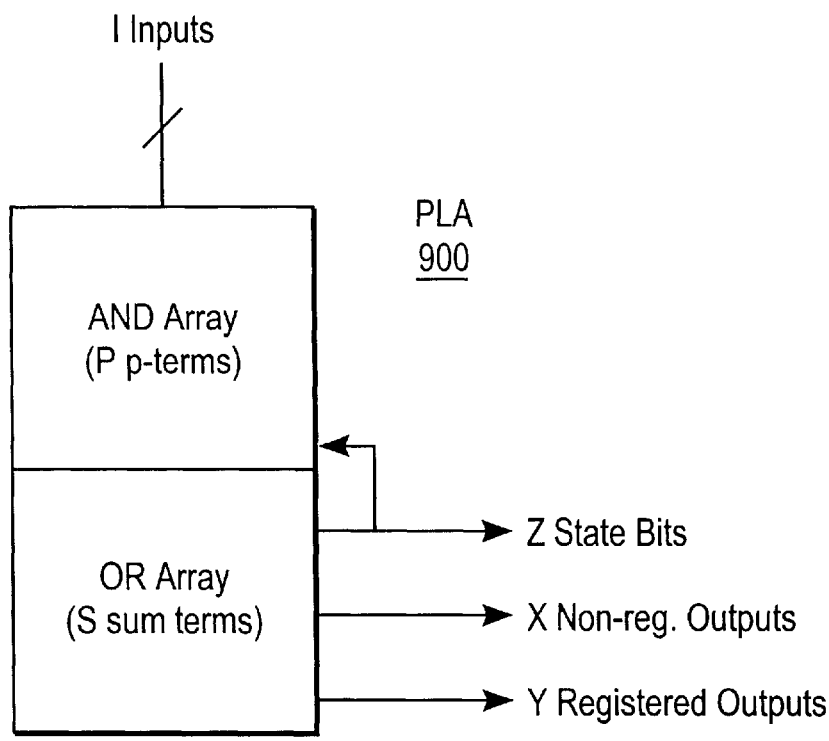
FIG. 7 is a generalized block diagram of a PLA in accordance with the invention.
Figure 8:
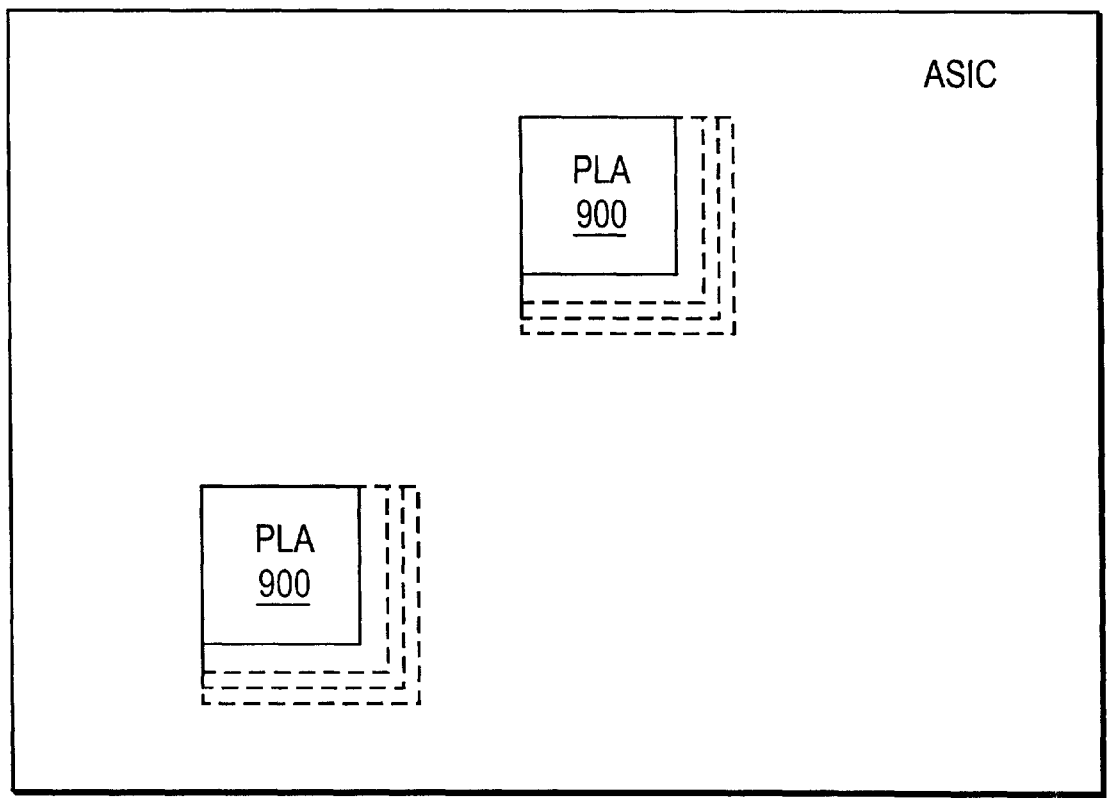
FIG. 8 is a generalized block diagram of a one-time configurable ASIC incorporating PLAs in accordance with the invention.

Hence, as shown in the generalized PLA structure 900 of FIG. 7, the number of inputs I, the number of product terms P, the number of sum terms S, the number of non-registered outputs X, the number of registered outputs Y, the number of state bits Z (registered output with feedback), and any other characteristics of the PLA are specified by the designer and/or software. Further, not only can a PLA structure 900 in accordance with the invention be implemented in a mask-programmed device in virtually any size with any features, but as shown in FIG. 8, there can be multiple PLAs 900 in one particular ASIC device, where each has a different size (indicated by dashed lines) and/or features.

Creating a PLA Within an ASIC

Figure 9:
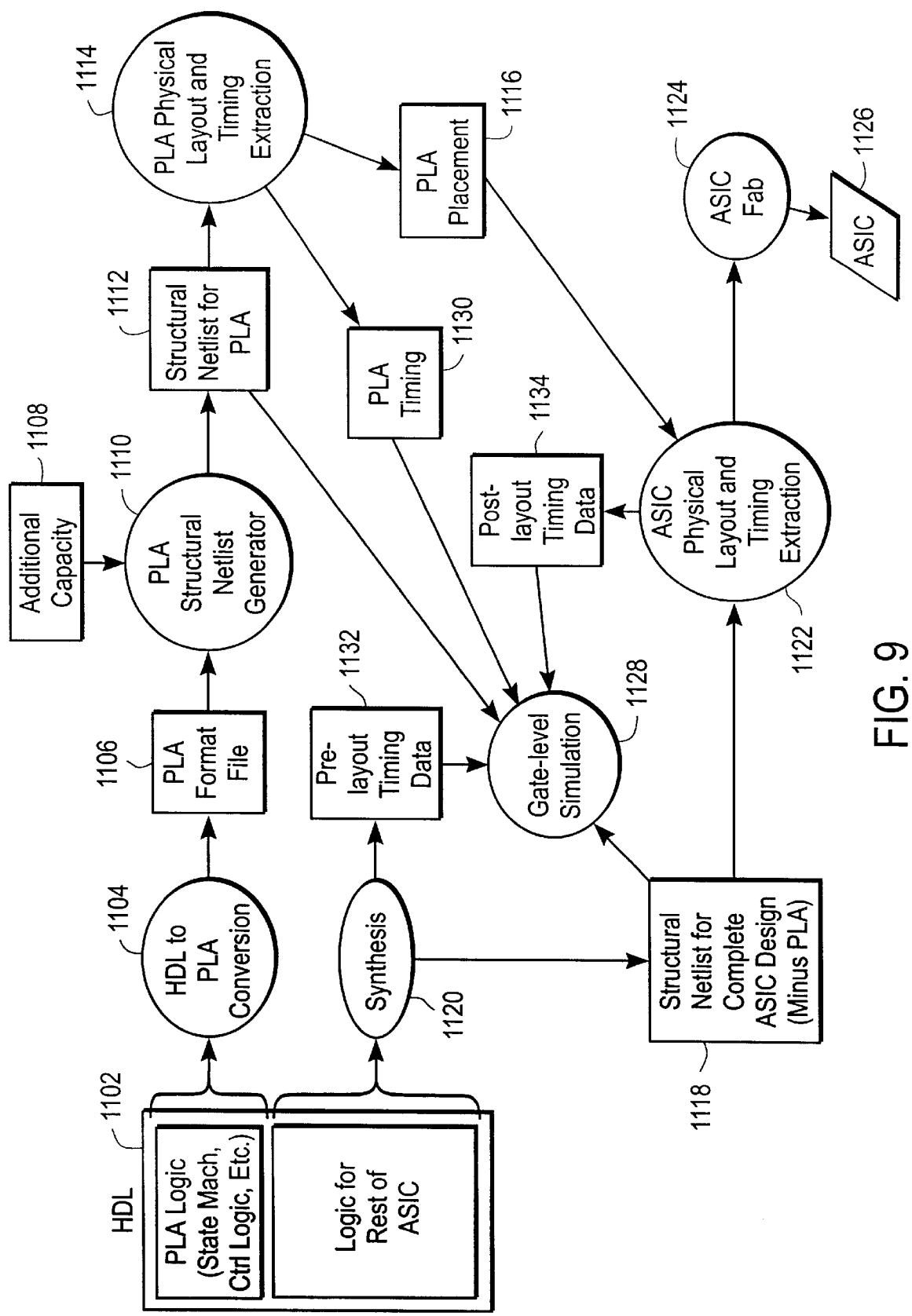
FIG. 9 is a generalized flow diagram illustrating the creation of a one-time configurable ASIC with a multi-time configurable portion in accordance with the invention.

The particular steps used to form a reprogrammable structure with a non-reprogrammable device in accordance with an embodiment of the invention are shown with respect to FIG. 9. As shown in FIG. 9, a user-defined circuit to be implemented by the ASIC device is functionally defined in HDL or other functionally similar language, 1102. The portions of that user-defined circuit that are to be reconfigurable are marked or designated by the user in some fashion, and then the marked portions are automatically converted 1104 to produce a PLA format file 1106 that can accommodate the specified reconfigurable functionality. In other words, a PLA sized for the functionality as specified by the user is first modeled. As a result of step 1104, a PLA Format File 1106 is generated that includes the number of product terms, sum terms, inputs, outputs, etc., as defined by the user's specified functionality.

Next, in some embodiments of the invention, additional capacity 1108 is added to the PLA format file 1106 (to accommodate changes and/or modifications in functionality later) in step 1110 to generate a structural netlist 1112 for the PLA. The amount of additional capacity 1108 can be determined by the circuit designer or it can be added automatically by software (e.g., by automatically making the PLA 10% larger than required to accommodate the user's functionality).

In one embodiment of the invention, structural netlist generation 1110 creates netlist 112 in terms of an ASIC library. Nonetheless, it is to be understood that in a preferred embodiment of the invention, although an ASIC cell library is utilized, the entire PLA is a custom PLA—i.e., the ASIC cell library does not include a primitive logic function for a PLA having a designated number of inputs, outputs, p-terms, etc., although other embodiments may utilize such a primitive logic function in a library. The structural netlist 1112 models the PLA that is actually to be constructed. After the netlist 1112 has been generated, PLA physical layout and timing extraction is performed 1114. As a result, a PLA placement 1116 is generated, defining a physical relationship among the functions that form the PLA. Such a placement can be used in many embodiments of the invention to optimize PLA performance.

In the meantime, a structural netlist 1118 for the rest of the ASIC has been synthesized 1120 from the HDL file 1102. The PLA placement 1116 is combined with a structural netlist for the complete ASIC (minus the PLA) 1118 to perform the physical layout and timing extraction 1122 for the entire ASIC device. Once the layout for the entire device has been performed, the ASIC can be fabricated (e.g., completely fabricated or selected layers mask-programmed) 1124, resulting in custom ASIC 1126 that includes a custom and reprogrammable PLA.

Simulation of the ASIC can be performed at various stages during the ASIC creation process of FIG. 9. For instance, once the structural netlist for the PLA 1112 and the netlist for the rest of the ASIC 1118 are generated, then functional simulations can be run 1128. Then once PLA physical layout and timing extraction is performed 1114, PLA timing data 1130 is generated and can be used for more accurate simulations with the pre-layout timing data 1132 for the rest of the ASIC. In many embodiments as well, the PLA can be simulated alone, without combination with the data for the rest of the ASIC. Finally, after physical layout and timing extraction 1122 for the entire ASIC is formed, post-layout timing data 1134 for the entire device is generated and further (even more accurate) simulations can be run. As should be understood, there are many options for providing timing data and other information for simulations and those described are exemplary only.

Many of the steps shown in FIG. 9 can be performed by either the ASIC supplier or the ASIC purchaser/user. For instance, in one embodiment, the user performs step 1104 and provides a PLA format file 1106 to the ASIC supplier who then performs steps 1110, 1114, 1122, and 1124. The user would receive timing data back from the supplier to perform simulations 1128. In other embodiments, the user further performs steps 1110, 1112, and 1122, while the supplier only performs 1124. In still other embodiments, the user will perform a subset of these steps (e.g., 1110 or 1110 and 1114) while the supplier performs the remainder. Hence, as should be understood, the steps performed by the user and those by the supplier will vary from embodiment to embodiment.

As should be further understood from the flow of FIG. 9, the PLA is generated and integrated into the rest of the ASIC automatically. There is no need for manual generation or placement of a custom PLA into the target ASIC technology. Moreover, many embodiments of the invention will not need special tools to create such a PLA but can use the standard tools that it would use for formation of the rest of the ASIC—for instance, the same place and route tools would be utilized. Thus, as used herein, the term "automatic" refers to lack of time-consuming manual generation, placement, or routing. The term "automatic" is not, however, meant to exclude all user or operator interaction from the process. For instance, even if the user/operator is prompted for a response between the steps illustrated in FIG. 9, the process is still considered automatic.

Generating a Programming Pattern

Figure 10:
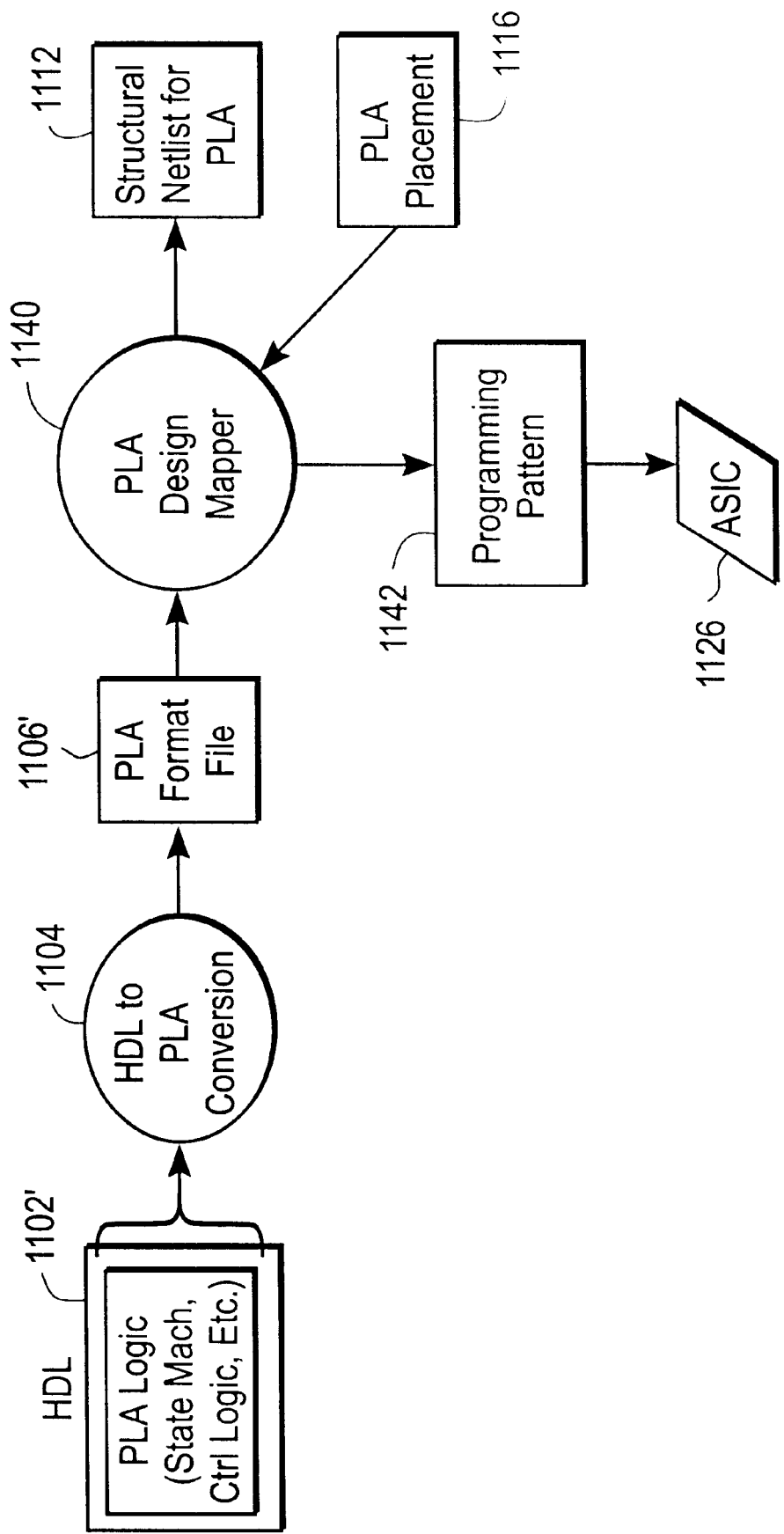
FIG. 10 is a generalized flow diagram illustrating the generation of a programming pattern to use in the programming of a multi-time programmable structure incorporated in a one-time configurable device in accordance with the invention.

FIG. 10 illustrates steps taken in order to reprogram a PLA incorporated into a one-time configurable ASIC in accordance with the invention. First, the HDL description of the new PLA functionality 1102' will be converted 1104 to create a PLA format file 1106', similar to that done in FIG. 9. Next, the structural netlist 1112 for the PLA and the PLA placement 1116 files (both of which were previously generated during the construction of the device (FIG. 9)) are used to map the new PLA format file 1106' in step 1140. As a result, a revised programming file 1142 is generated that contains the programming pattern that is to be loaded into the already built ASIC 1126. (The actual loading of the program data will be discussed below.)

Physical Structure

Figure 1:
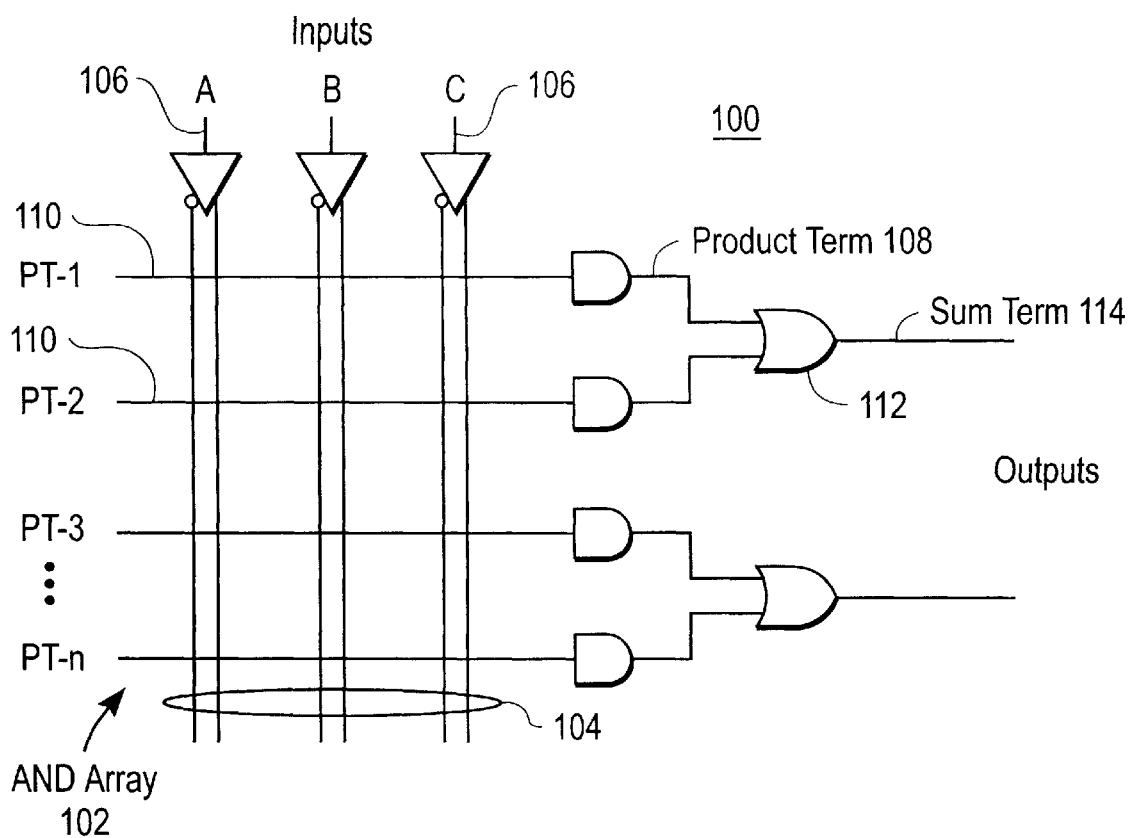
FIG. 1 is a generalized circuit diagram of a PAL.
Figure 2:
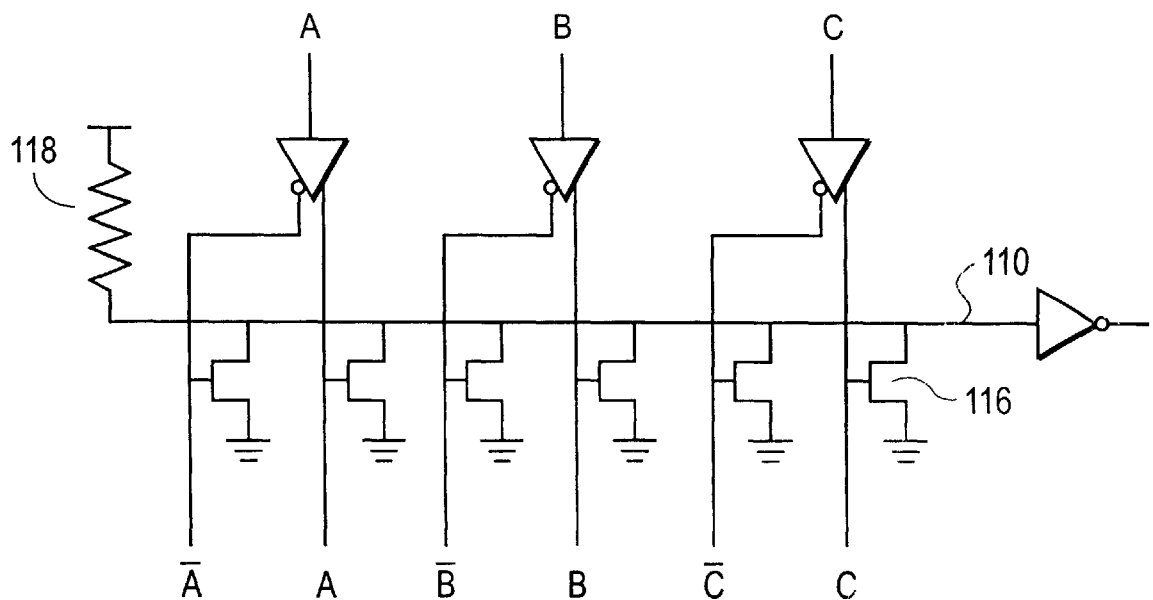
FIG. 2 is a circuit diagram illustrating a more specific circuit diagram of a portion of a PLA.
Figure 3:
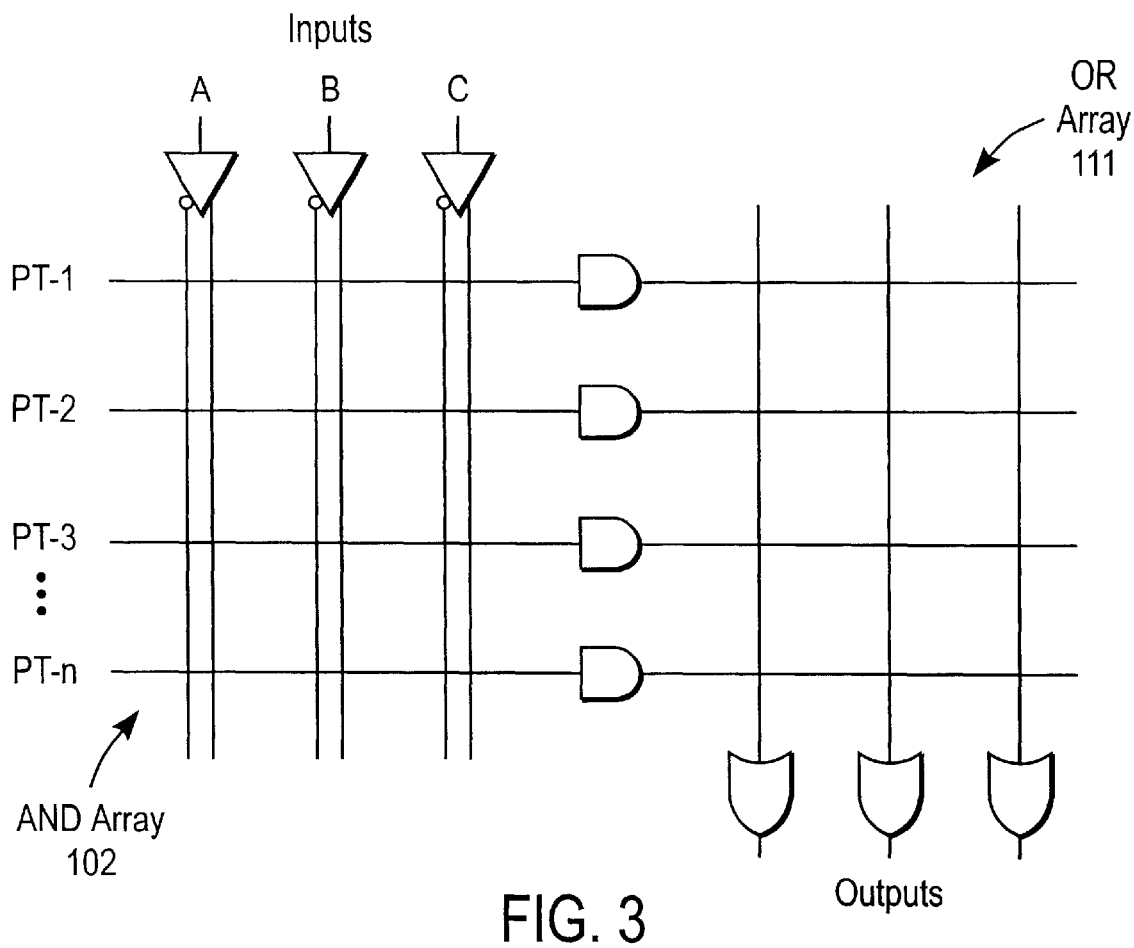
FIG. 3 is a generalized circuit diagram of a full PLA.
Figure 4:
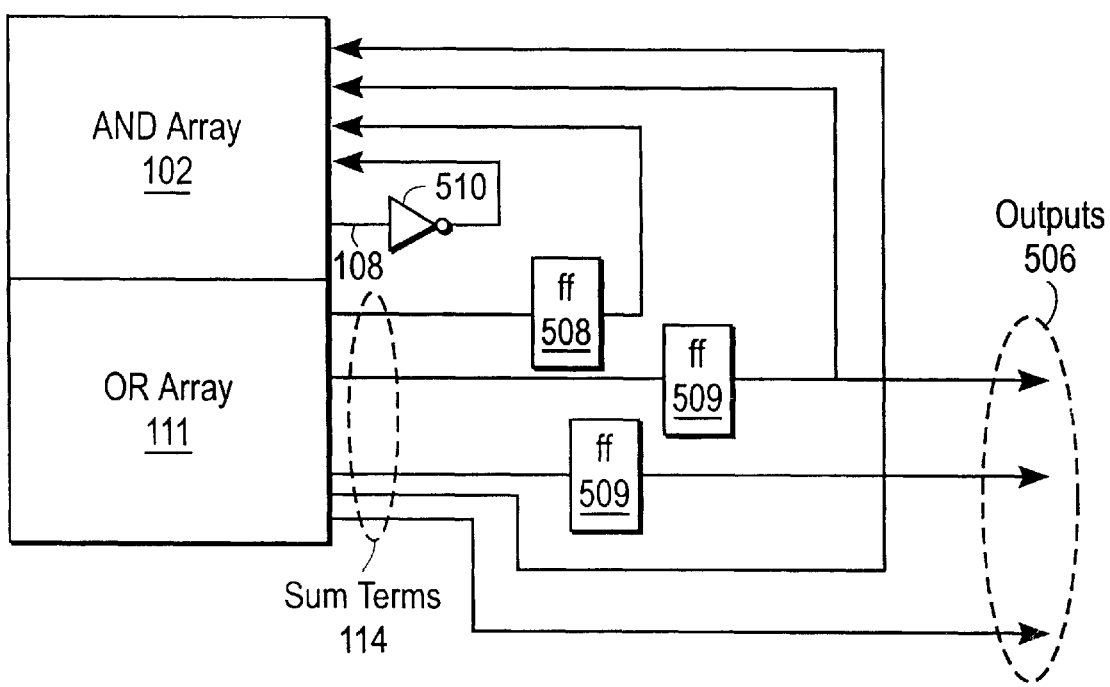
FIG. 4 is a generalized block diagram illustrating flip-flops used to enhance PLA functionality.
Figure 5:
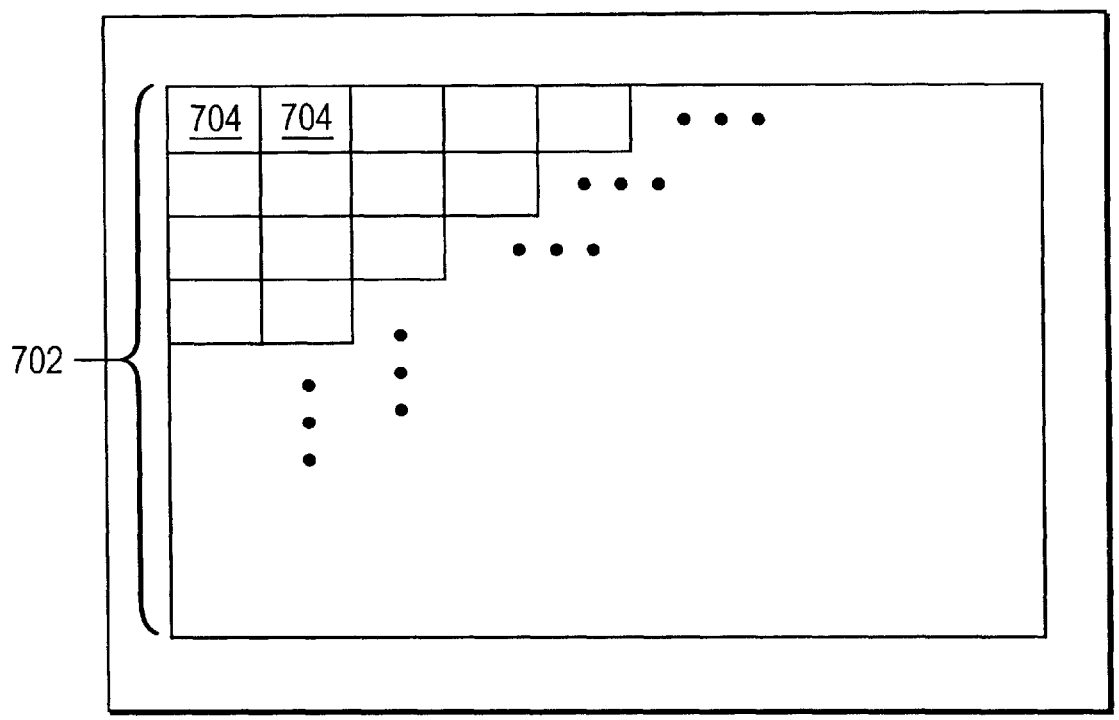
FIG. 5 is a generalized block diagram of an MBA.
Figure 6:
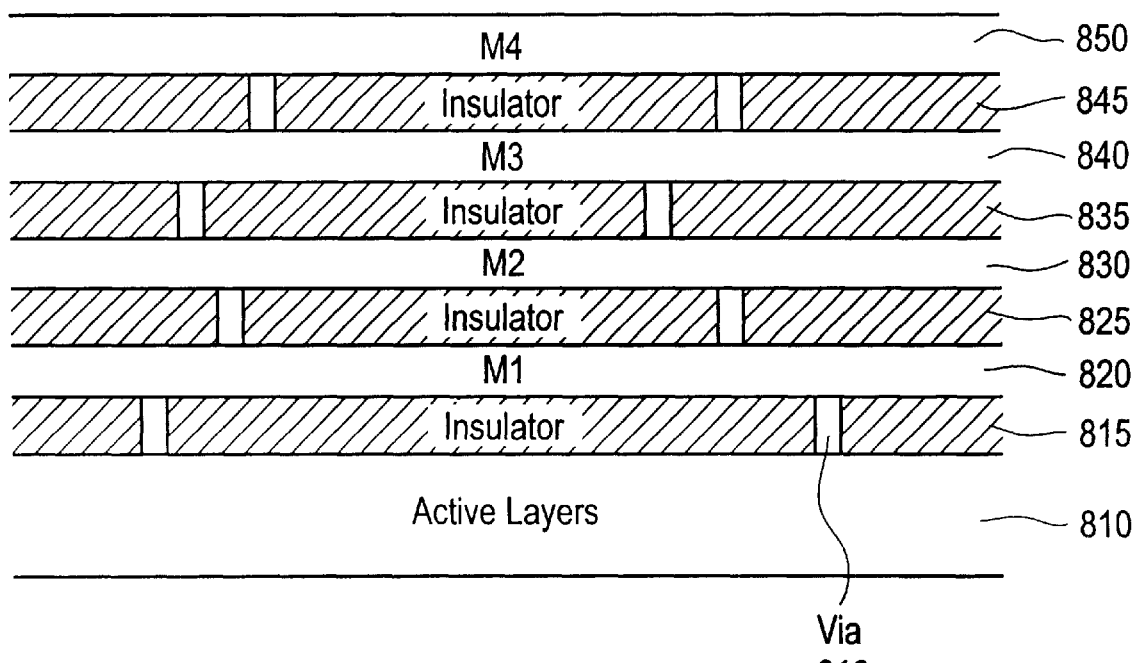
FIG. 6 is a generalized cut away view showing the layers of an ASIC.

The structure for a PLA device in accordance with the invention will vary with the ASIC technology utilized. For instance, in one embodiment using a standard cell where all the layers are customized, the structure of a PLA device in accordance with the invention can be designed to look much like conventional PLAs as described with respect to FIG. 2—e.g., product terms implemented with a wired-OR mechanism by connecting multiple transistors to a product term line. Likewise, with many gate arrays where transistors in function blocks are not interconnected (or are minimally connected) in each function block, a FIG. 2—like structure may be implemented.

This wired-OR approach, however, typically requires a PLA structure with a regular array, i.e., one that has wired-OR lines that have the same length and loading, because it usually uses sense amps coupled to that line to amplify signals. If the wired-OR lines are not all the same length with the same loading, then the sense amps would necessarily also have to be different, creating more complicated design issues.

Therefore, in other embodiments, the structures will be different. In MBA devices, for example, circuits in each function block are pre-defined (i.e., designed and/or formed prior to receiving the user-defined circuit) and often do not contain leftover or otherwise available transistors to implement conventional PLA configurations. The existing functionality and/or devices must be adapted.

Figure 11:
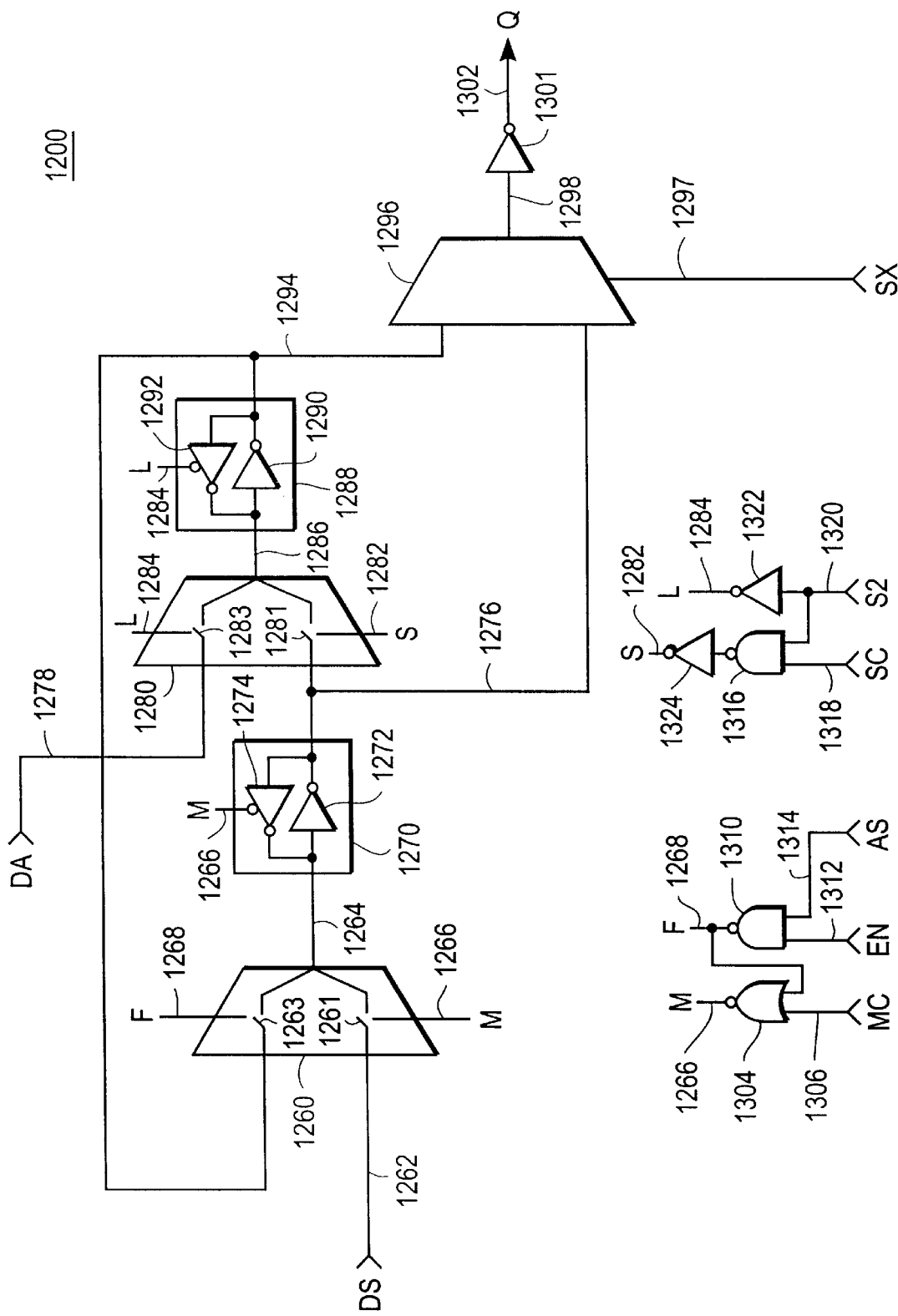
FIG. 11 is a function block diagram in an MBA used in one embodiment of the invention.

An example of a function block 1200 in an MBA used in one embodiment of the invention is functionally shown in FIG. 11. Function block 1200 generally includes three multiplexers 1260, 1280, and 1296 and two bit-storage units 1270 and 1288. First multiplexer 1260 has a first input for receiving a signal DS on line 1262 and a second input, which is coupled to the output of bit-storage unit 1288 via line 1294. DS serves as a signal input into function block 1200. Multiplexer 1260 has two internal paths to its output on line 1264. The first, or upper, path couples the input on line 1294 to multiplexer output on line 1264 when switch 1263 is closed. Switch 1263 is controlled by signal F on line 1268. The second, or lower, path couples the DS signal on line 1262 to the output on line 1264 when switch 1261 is closed. Switch 1261 is controlled by signal M on line 1266. Multiplexer 1260, and others like it, are herein referred to as "dual-control multiplexers."

Bit-storage unit 1270 receives as an input the output from dual-control multiplexer 1260 online 1264. In one embodiment of the invention, bit-storage unit 1270 is a pair of cross-coupled inverters 1272 and 1274 as shown in FIG. 11. Inverter 1274 is generally designed to be weaker than inverter 1290 in order to allow any changing bit outputs from multiplexer 1260 to be placed in bit-storage unit 1270 by overdriving inverter 1274. In addition, inverter 1274 is enabled and disabled by signal M on line 1266. Thus, bit-storage unit 1270 can be configured to appear as a simple inverter in certain configurations of function block 1200.

Dual-control multiplexer; 1280 receives as a first input the output of bit-storage unit 1270 on line 1276. The other input to multiplexer 1280 is coupled to signal DA on line 1278, an input into function block 1200. Similar to multiplexer 1260, multiplexer 1280 has two signal paths, each controlled by a respective switch 1281 or 1283. Signal S on line 1282 controls switch 1281 while signal L on line 1284 controls switch 1283.

Bit-storage unit 1288 receives as an input the output of dual-control multiplexer 1280 on line 1286. Like bit-storage unit 1270, bit-storage unit 1288 is, in one embodiment, composed of a pair of cross-coupled inverters 1290 and 1292, where inverter 1292 is weaker than inverter 1272, and where inverter 1292 is selectively enabled by signal L on line 1284.

Multiplexer 1296 receives as a first input the output of bit-storage unit 1288 on line 1294. The second input to multiplexer 1296 is received from the output 1276 of bit-storage unit 1270. Multiplexer 1296 further has a select input SX, which multiplexer 1296 receives on line 1297 and which selects one of the multiplexer's inputs to be output onto line 1298.

Line 1298 is coupled to inverter 1301, which serves as a buffering mechanism and which outputs signal Q on line 1302.

In addition, function block 1200 also includes select and enable logic, which selects the various switches in multiplexers 1260 and 1280 as well as enables inverters 1274 and 1292 in bit-storage units 1270 and 1288, respectively. The select and enable logic in one embodiment includes NOR gate 1304, NAND gate 1310, NAND gate 1316, and inverters 1322 and 1324.

NOR gate 1304 has a first input MC on line 1306, an input into function block 1200, and a second input received from the output of NAND gate 1310 via line 1268. NOR gate 1304 outputs signal M on line 1266, which controls switch 1261 and enables inverter 1274.

Inputs to NAND gate 1310 are EN on line 1312 and AS on line 1314, both inputs to function block 1200. The output 1268 from NAND gate 1310 is the signal F which controls switch 1263 in multiplexer 1260.

NAND gate 1316 receives as inputs signal SC on line 1318 and signal S2 on line 1320, both inputs to function block 1200. The output of NAND gate 1316 is coupled to inverter 1324, which outputs signal S on line 1282 to control switch 1281 in multiplexer 1280.

Inverter 1322 also receives signal S2 on line 1320 and outputs signal L on line 1284 to control switch 1283 of multiplexer 1280 as well as inverter 1292 in bit-storage unit 1288.

While select and enable logic for function block 1200 is shown in FIG. 11 as NOR, NAND, and inverting gates, a person of ordinary skill in the art will recognize that a number of other gate combinations are possible. Further, select and enable logic is not shown fully connected in FIG. 11 to aid in the clarity of the figures. However, the connections should be clear to those of skill in the art by the signal names and/or line reference numbers provided.

In some embodiments of the invention, function block 1200 forms only a portion of a larger function block. A more detailed explanation of these function blocks and MBAs can be found in Function Block Architecture for Gate Array, Ser. No. 08/821,475, filed on Mar. 21, 1997, and Test Circuitry for ASICs, Ser. No. 08/985,790, filed on Dec. 5, 1997, both incorporated by reference herein.

Figure 12:
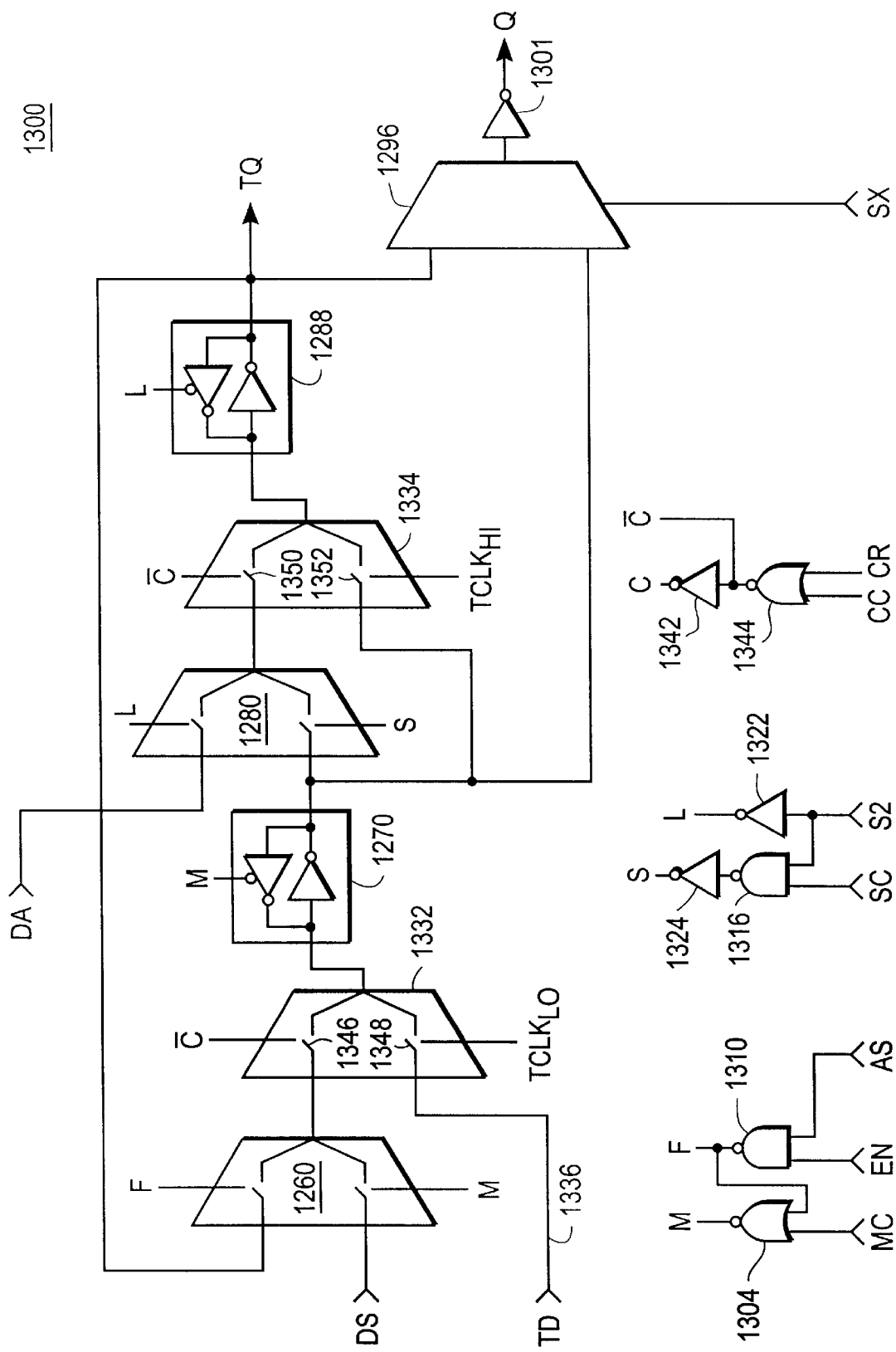
FIG. 12 is a function block diagram in an MBA used in another embodiment of the invention.

A second embodiment of the invention utilizes a function block such as that shown in FIG. 12. The function block 1300 of FIG. 12 is similar to that of FIG. 11 with the following modifications. Two additional dual-control multiplexers 1332 and 1334 are added. The output of dual-control multiplexer 1260 is coupled to the first input of dual-control multiplexer 1332 while the second input of dual-control multiplexer 1332 is coupled to input TD on line 1336. The output of dual-control multiplexer 1332 is coupled to bit-storage unit 1270. Dual-control multiplexer 1334 has its first input coupled to the output of dual-control multiplexer 1280 and its second input coupled to the output of bit-storage unit 1270. The output of dual-control multiplexer 1334 is coupled to bit-storage unit 1288.

In addition in FIG. 12, select and enable logic additionally includes NOR gate 1344 and inverter 1342. NOR gate 1344 receives a CC signal on one input and a CR signal on a second input. CC and CR are also sometimes referred to herein as a column mode select signal and a row mode select signal, respectively. The output of NOR gate 1344 carries signal $\overline{C}$ while the output of inverter 1342 carries signal C. Signals C and $\overline{C}$ act as "program" indication signals as will be later discussed. $\overline{C}$ is coupled to switch 1346 in multiplexer 1332 and switch 1350 in multiplexer 1334. Two additional signals are provided: $TCLK_{LO}$ and $TCLK_{HI}$. $TCLK_{LO}$ is coupled to switch 1348 in multiplexer 1332 and $TCLK_{HI}$ is coupled to switch 1352 in multiplexer 1334. TQ is output from bit-storage unit 1288.

The function blocks 1200 and 1300 described with respect to FIGS. 11 and 12 can be configured to incorporate a variety of both combinational and sequential functionality simply by changing the signals coupled to the inputs. For instance, inputs can be coupled to a logical 1 (e.g., a "high" value, $V_{CC}$, etc.), a logical 0 (e.g., a "low" value, gnd, etc.), an output from another function block 1200/1300, or an input into the integrated circuit itself In particular, a function block 1200/1300 can be configured to function as a latch or a flip-flop. For instance, to implement a flip-flop, the data input (D-input) of the flip-flop is applied to input DS 1262. The output Q 1302 from the function block is also the output (Q) of the flip-flop. A clock signal (CLK) is applied to inputs MC 1306 and SC 1318. An enable signal is applied to input EN 1312. A clear signal or a preset signal is applied to inputs AS 1314 and S2 1320. DA 1278 is connected to a logical low for a clear signal or to a logical high for a preset signal. SX 1297 is tied to a logical low. In this manner, a data bit input at DS will pass serially through bit storage unit 1270 and bit storage unit 1288, and the implementation acts as a master-slave configuration. Thus, when input data is input on line DS and switch 1261 closes (driven by CLK) then the input data will be stored in units 1270 and 1288. When switch 1261 opens, bit storage units 1270 and 1288 remain undisturbed and hold the last bit stored. A latch can be implemented in a similar manner, but only one bit storage unit needs to be utilized.

Figures 13, 13A:
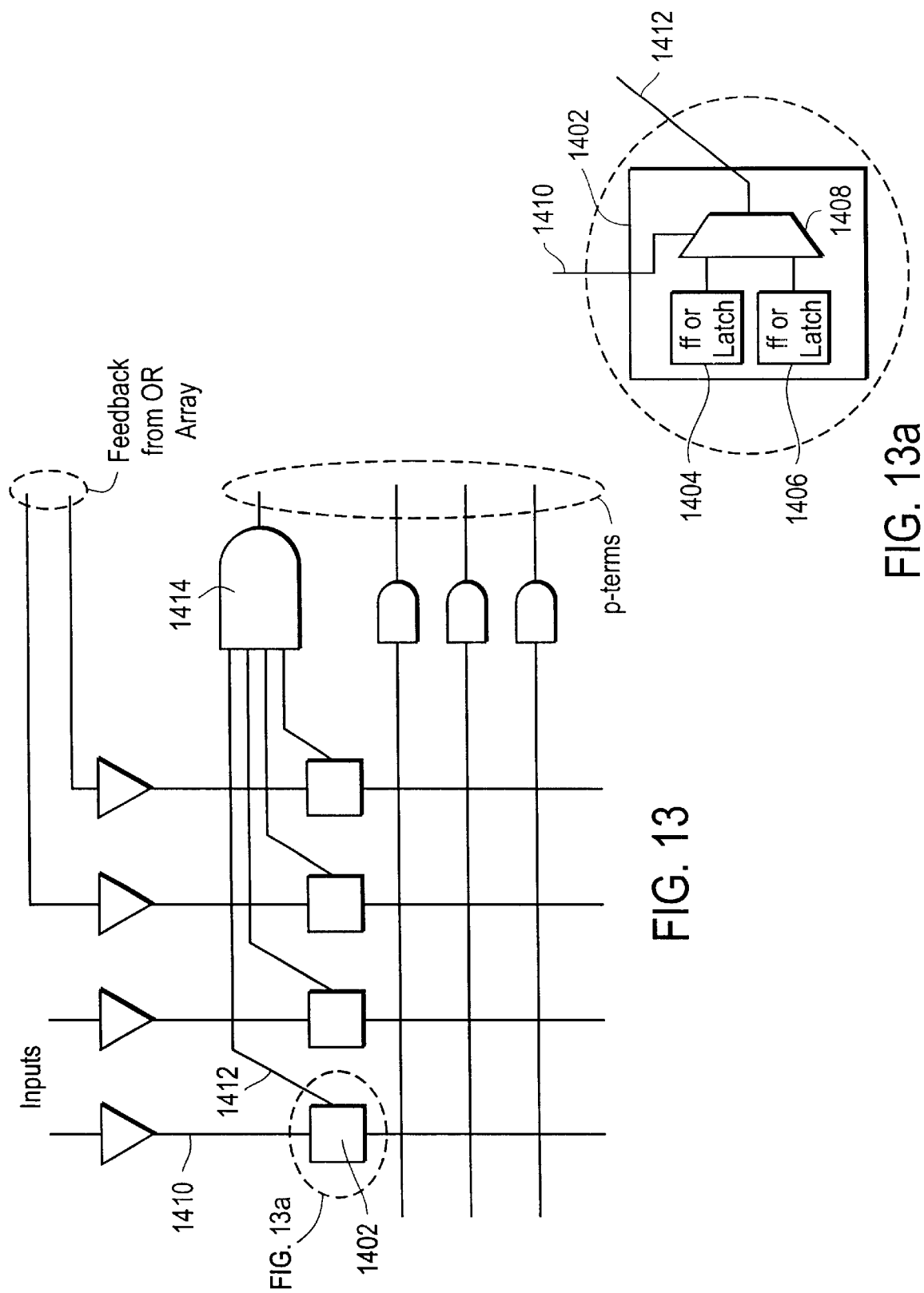
FIGS. 13 and 13a show a function block diagram illustrating a configuration of the function block of either FIGS. 11 or 12 used in an embodiment of the invention.

Referring now to FIGS. 13 and 13a, function blocks (such as 1200 or 1300) configured as two latches or as two flip-flops can be used to form a PLA core cell 1402. For discussion purposes only, these devices in the core cells will simply be referred to herein as latches, although it is to be understood that they could be flip-flops in various embodiments. The core cell 1402 includes latch 1404 and latch 1406. Each latch 1404, 1406 is coupled to mux 1408. The select line 1410 to mux 1408 is an input to the AND array. The mux output 1412 is input into multi-input AND gate 1414, whose output forms a product term. AND gate 1414 may be formed using a tree of AND gates as will be understood in the art. It is to be understood that, in addition to the latches, all of the logic shown in FIG. 13 can be implemented with function blocks, such as 1200 or 1300.

Each latch 1404, 1406 is programmed to store a value that dictates how the core cell 1402 will behave upon receiving an input signal on line 1410 into the PLA. Programming is done in accordance with Table 1:

TABLE 1

| Latch 1404 | Latch 1406 | Output 1412 |
|---|---|---|
| 1 | 0 | Positive (I) |
| 0 | 1 | Negative ($\bar{I}$) |
| 1 | 1 | Don't care |
| 0 | 0 | Disable P-terms |

Thus, when latch 1404 stores a logical 1 and latch 1406 stores a logical 0, the signal input on line 1410 will be output on line 1412. When latch 1404 stores a logical 0 and latch 1406 stores a logical 1, the signal input on line 1410 will be inverted on line 1412. When both latches 1404 and 1406 store a logical 1, it indicates a "don't care" condition—no matter what is input on line 1410, the product-term will not be affected. But if latches 1404 and 1406 both store a logical 0, the entire p-term will be disabled (a 0 input into an AND gate always results in a 0 output).

Figures 14, 14A:
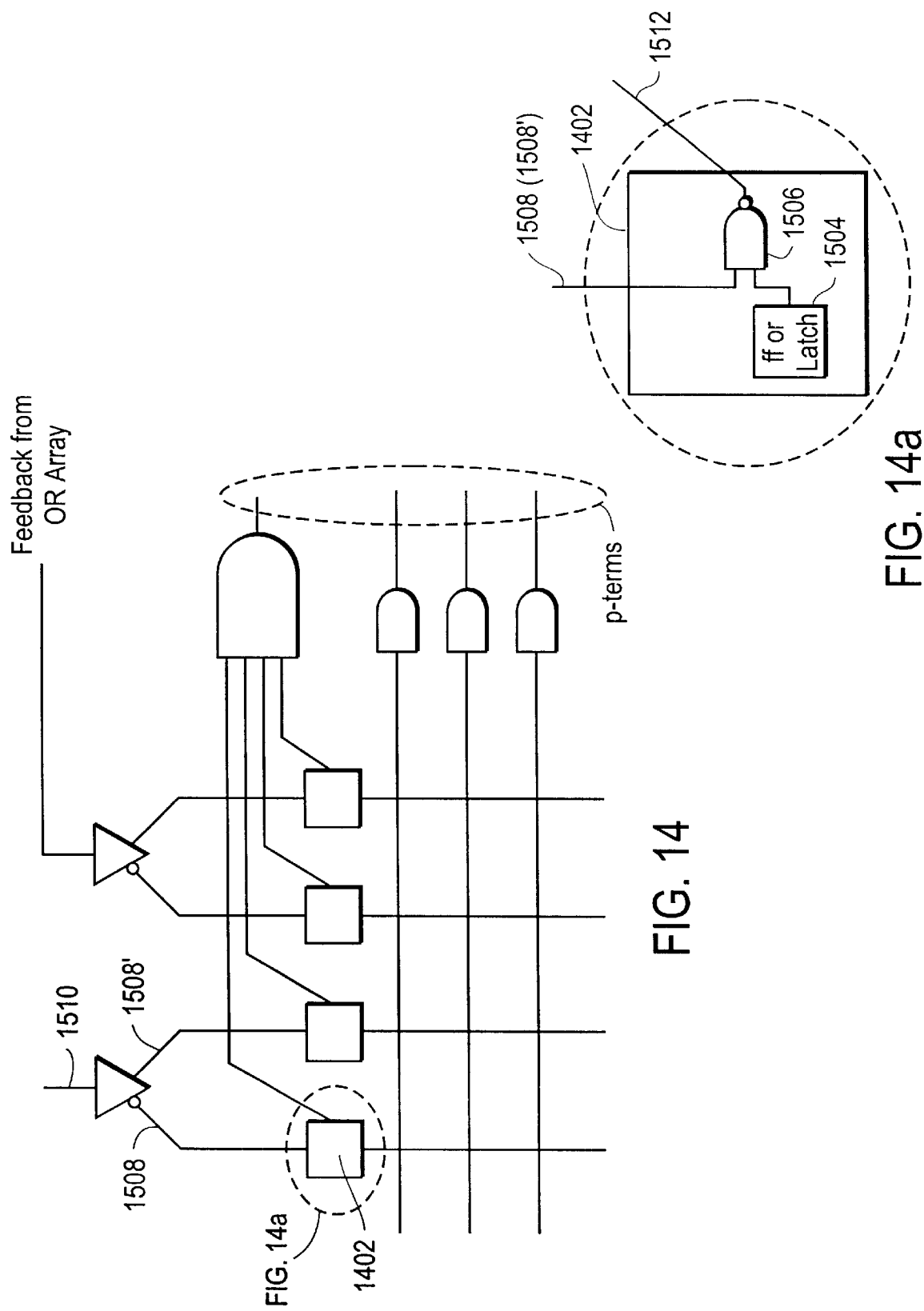
FIGS. 14 and 14a show a function block diagram illustrating a second configuration of the function block of either FIGS. 11 or 12 used in an embodiment of the invention.

An alternative embodiment of a PLA core cell 1402 is shown in FIGS. 14 and 14a. In FIG. 14a, a single latch or flip-flop 1504 is coupled to an NAND gate 1506, where both the latch 1504 and 2-input NAND gate 1506 can be formed using function blocks, such as 1200 or 1300. The second input 1508 (or 1508') to the 2-input NAND gate is formed from the input signal 1510 or its complement. When latch 1504 stores a logical 1, the output of NAND gate 1506 carries the inversion of the signal input on line 1508 (1508'). When the latch 1504 stores a logical 0, the input is a "don't care"—it will not effect the p-term.

A comparison of FIGS. 13 and 14 illustrates that in FIG. 14, while only one storage device 1504 is required two physical input lines 1508, 1508' (one positive and one negative) must be run through the array while in FIG. 13 two storage devices are utilized, 1404 and 1406, but only one physical input line 1410 need be run through the array. Although both embodiments are useful, FIG. 13 has the advantage in deep-submicron semiconductor technology that the total wire-length has been cut in half. Although the fanout-dependent loading in FIG. 13 will be double that of FIG. 14, it is not fanout loading but absolute wire length that is the predominant factor in determining delays in today's semiconductor devices.

Nonetheless, both the embodiments illustrated in FIGS. 13 and 14 are advantageous over wired-OR structures. First, the structures of FIGS. 13 and 14 do not require a regular array structure. In fact, during implementation, portions of a particular array may be spread throughout a particular ASIC. Still, even if all portions of the PLA were located in proximity to one another, these portions can be scrambled—in other words, in its physical implementation, the array need not be regular and the structure may not match its conventional counterparts.

Further, wired-OR structures are notorious for static power consumption since anytime the product-term line is pulled low, current flows. But since the structures of FIGS. 13 and 14 use gates, static power consumption can be minimized.

A PLA using a structure such as those shown in FIGS. 13 and 14 is further advantageous. In addition to using a regular array structure, in all past attempts to include a PLA structure into a standard cell, a custom layout was required that had to be performed manually—a time-consuming, expensive, and burdensome task. But, in accordance with the invention, a PLA structure can be generated automatically for an MBA, a standard cell, or a gate array. Although each PLA is custom to each ASIC in terms of size, number of inputs, outputs, etc., a library can be used to implement each core cell. For instance, a library can store as a core cell the implementations shown in FIGS. 13, 14, or both. In this manner, a standard cell, a gate array, or an MBA that includes a PLA structure can be designed and implemented rapidly and cheaply (using the steps of FIG. 9).

Programming (Loading the Programming Pattern)

In order to program and/or reprogram a PLA embedded in a one-time configurable ASIC in accordance with the present invention, several alternatives exist. In one embodiment, a JTAG (or similar) controller can be used as will be understood in the art to shift a programming pattern through a test scan path.

Figure 15:
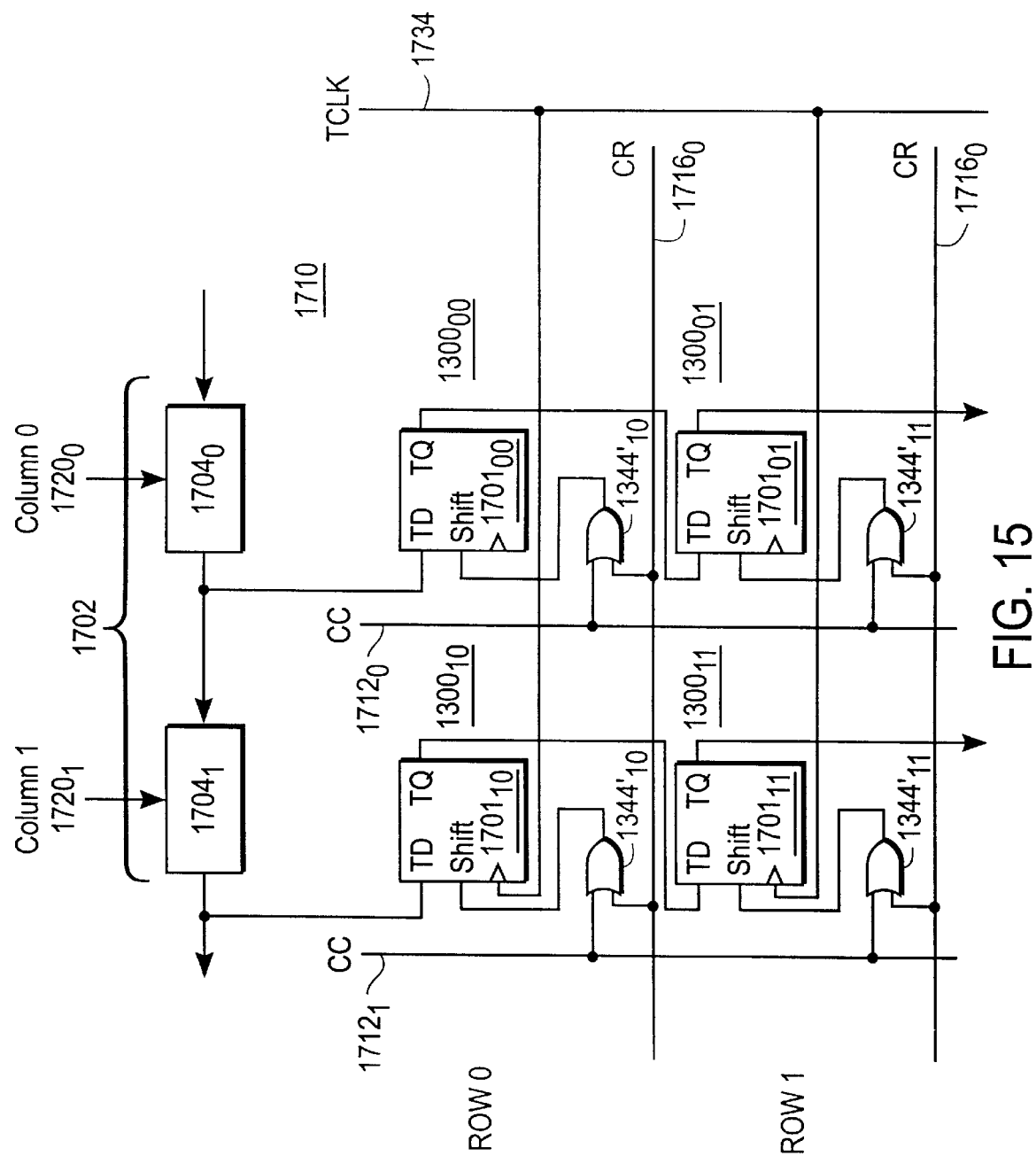
FIG. 15 is a function block diagram of a portion of an MBA used in one embodiment of the invention that is useful for loading a programming pattern into a PLA in accordance with the invention.

A second embodiment uses an array structure with function blocks such as those of FIG. 12 where the function blocks 1300 used to form the PLA are configured as flip-flops that are "daisy-chained" together and can be programmed using external pins. An example is shown in FIG. 15. Specifically, in an array 1710 of function blocks 1300 where the function blocks are configured to behave as flip-flops, the flip-flops in each column $1720_i$ of array 1710 are "daisy-chained" together. For example, in Column 1 $1720_1$ the TQ output of flip-flop $1701_{10}$ is coupled to the TD input of flip-flop $1701_{11}$. The daisy-chain continues to the bottom of the column $1720_1$. Likewise, the flip-flops of Column 0 $1720_0$ would be similarly daisy-chained.

Referring back to FIG. 12 in operation when $\overline{C}$ is a logical low signal (C is a logical high), the function block is in a "program" mode of operation. When in a program mode of operation ($\overline{C}$ is a logical low), TCLK, distributed through the signals $TCLK_{LO}$ and $TCLK_{HI}$, permits the shift of data from the data input on line TD through bit-storage units 1270 and 1288 and out through TQ. In one embodiment of the invention $TCLK_{LO}$ and $TCLK_{HI}$ are inverse signals to one another, being derived from the same clock TCLK (i.e., when $TCLK_{LO}$ is high, $TCLK_{HI}$ is low and vice versa), and both $TCLK_{LO}$ and $TCLK_{LI}$ only distribute TCLK when the array is in a program mode of operation, otherwise leaving switches 1348 and 1352 open. (In one embodiment of the invention, these signals may also be used in testing of the MBA as described in the application entitled "Test Circuitry for ASICs" mentioned previously).

Now referring again to FIG. 15, FIG. 15 illustrates several of the function blocks $1300_{ij}$ configured as flip-flops with the TQ/TD lines daisy-chained. Note that NOR gate 1344 and inverter 1342 are shown in FIG. 14 simply as OR gate 1344' having one input coupled to CR and one input coupled to CC.

To load the flip-flops and thus program the PLA, all rows and columns are first selected to be in a program mode by applying logical high values to all of the CR lines $1716_j$ and/or all of the CC lines $1712_i$. PLA program values are placed in a shift register 1702, where the output of each stage $1704_i$ of the shift register 1702 is coupled to the TD input of the first flip-flop $1701_{i0}$ in each column, in one embodiment of the invention. Applying TCLK 1734, PLA program values are applied one at a time, from shift register stages $1704_i$ to the respective daisy-chains where they are simultaneously shifted through each column $1720_i$ via the daisy-chains. When all values have been shifted to the appropriate flip-flops, CC and CR are de-asserted.

In many embodiments of the invention, it will be desirable to have the ability to load a default programming pattern into the "programming memory" (e.g., latches or flip-flops) of the PLA. Such a default pattern would be written into the programming memory by a signal that is, for instance, related to the system power-on-reset or similar signal, setting all programming memory elements to a predetermined value.

Figure 16:
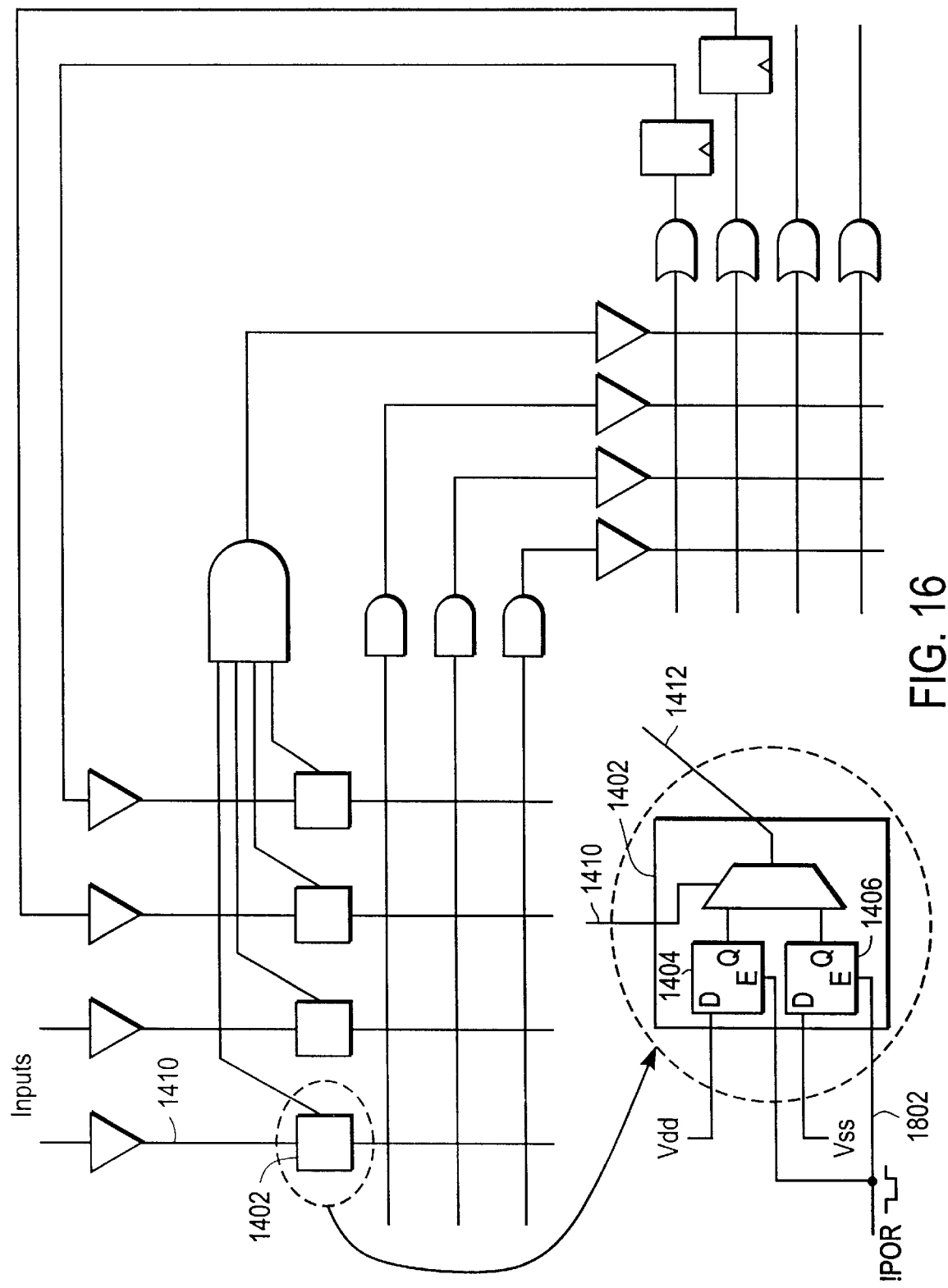
FIG. 16 shows the configuration of FIG. 12 and further illustrates use of a default pattern in accordance with an embodiment of the invention.

For instance, shown in FIG. 16 is an embodiment of the invention that utilizes the core cell of FIG. 13. The D inputs on the latches are tied to $V_{DD}$ (logical 1) or $V_{SS}$ (logical 0) to set them to the desired initial condition. These default values would be built into the PLA during the construction of the ASIC (FIG. 9). This default programming pattern would be loaded using a signal like a power-on-reset pulse (!POR) 1802.

In another embodiment, such as implementing a PLA in a standard cell, or even loading the PLA dynamically during the operation, the loading mechanism will be able to choose between a default pattern (if one is used) and a new pattern used for reprogramming. In such a case, the circuit of FIG. 17 can be utilized. As shown, the inputs to latches 1404 and 1406 are coupled to respective muxs 1902 and 1904. One input of each mux 1902, 1904 is connected to a default value, such as $V_{DD}$ or $V_{SS}$. The second input is coupled to an external data line 1906, 1908, which can come from I/O pads, from RAM, or from another source. The select line 1910 of the muxs selects between whether the default values or other external values will be loaded. A load pulse is provided through OR gate 1912, which receives power-on-reset as one input and a write pulse as a second input.

Figure 17:
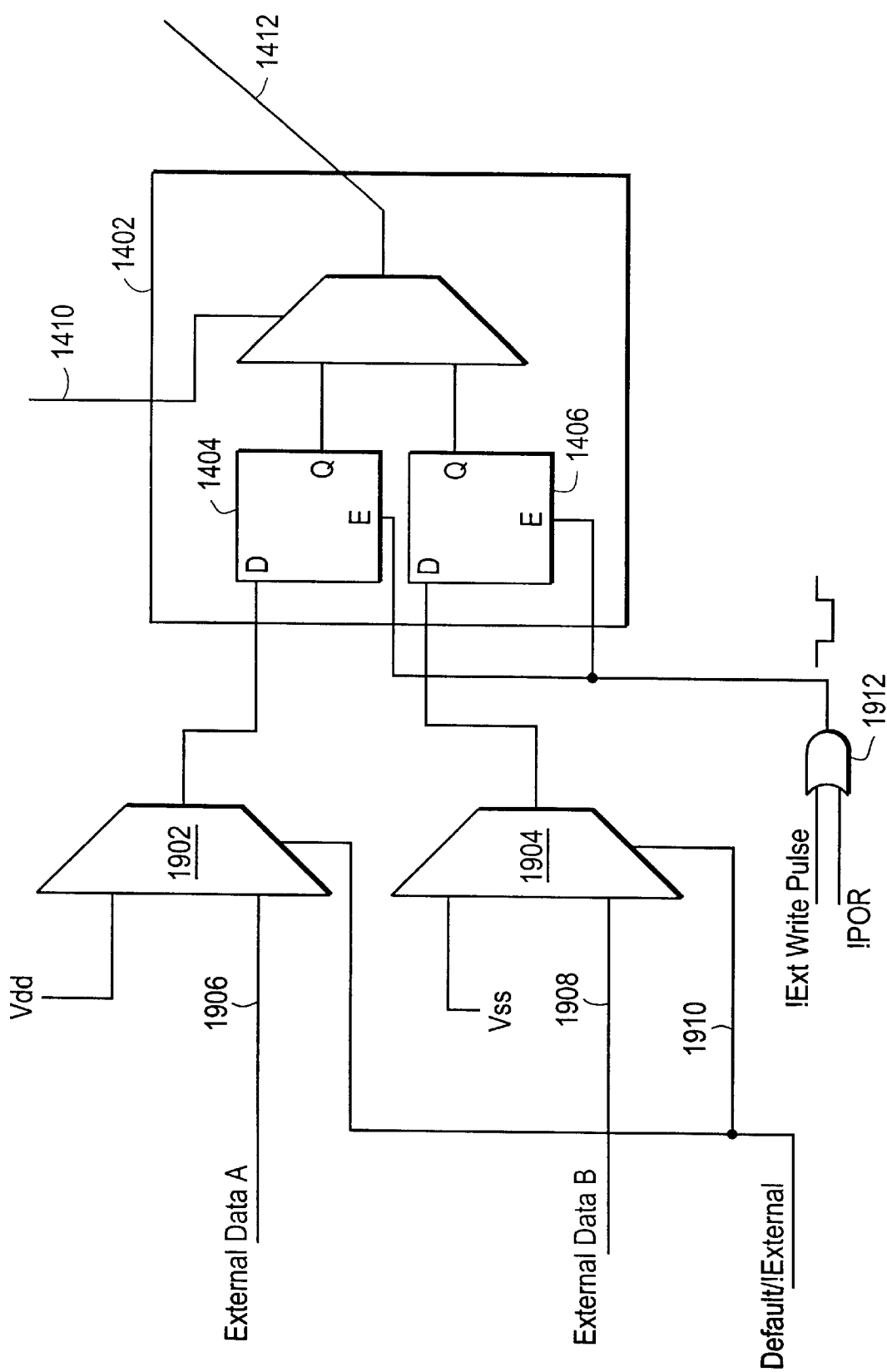
FIG. 17 shows the embodiment of FIG. 12 and further illustrates an embodiment that uses both a default pattern and external loading.

The embodiment shown in FIG. 17 can be useful not only for dynamic loading of a program pattern during operation but also for loading programming values into only a portion of the PLA instead of the entire array.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A method for creating a one-time configurable integrated circuit that includes a reprogrammable portion, comprising:

(a) receiving a description of circuit functionality specified by a user for implementation with the one-time configurable integrated circuit, the circuit functionality having a portion designated by the user to be reprogrammable;

(b) automatically modeling a reprogrammable structure that is capable of implementing the designated portion of the circuit functionality;

(c) automatically performing physical layout for the entire one-time configurable integrated circuit, including both the reprogrammable structure as well as the rest of the circuit functionality specified by the user, wherein the physical layout for the reprogrammable structure is customized.

2. The method of claim 1, wherein step (b) includes automatically modeling the reprogrammable structure to implement only the designated portion of the circuit functionality.

3. The method of claim 1, wherein step (b) includes automatically modeling said reprogrammable structure with added capacity.

4. The method of claim 1, wherein step (c) includes: (i) performing physical layout for the reprogrammable structure; (ii) subsequently, performing physical layout for the rest of the circuit functionality.

5. The method of claim 1 further including:

(d) fabricating the one-time configurable integrated circuit.

6. The method of claim 5, further including:

generating a programming pattern;

programming the reprogrammable structure within the one-time configurable integrated circuit based on the programming pattern.

7. The method of claim 6, wherein:

the step of generating a programming pattern includes generating a programming pattern in accordance with the functionality designated by the user to be reprogrammable and including that programming pattern as a default pattern built into the one-time configurable integrated circuit; and the step of programming includes loading the default pattern.

8. The method of claim 7, further comprising:

receiving a second description of circuit functionality specified by the user;

generating a second programming pattern based on the second description of circuit functionality; and reprogramming the reprogrammable structure using the second programming pattern.

9. The method of claim 6, further including:

generating a second programming pattern;

programming the reprogrammable structure based on the second programming pattern.

10. The method of claim 1, wherein automatically modeling a reprogrammable structure that is capable of implementing the designated portion of the circuit functionality includes creating a netlist.

11. The method of claim 1, wherein receiving a description of circuit functionality specified by a user for implementation with the one-time configurable integrated circuit, the circuit functionality having a portion designated by the user to be reprogrammable includes receiving a PLA format file.

12. The method of claim 1, wherein receiving a description of circuit functionality specified by a user for implementation with the one-time configurable integrated circuit, the circuit functionality having a portion designated by the user to be reprogrammable includes receiving an HDL file.

13. A computer readable medium having a set of instructions stored therein, which when executed by a computer causes the computer to perform the steps of:
  (a) receiving a description of circuit functionality specified by a user for implementation with a one-time configurable integrated circuit, the circuit functionality having a portion designated by the user to be reprogrammable;
  (b) automatically modeling a reprogrammable structure that is capable of implementing the designated portion of the circuit functionality;
  (c) automatically performing physical layout for the entire one-time configurable integrated circuit, including both the reprogrammable structure as well as the rest of the circuit functionality specified by the user,
  wherein the physical layout for the reprogrammable structure is customized.

14. The computer readable medium of claim 13, wherein step (b) includes automatically modeling said reprogrammable structure with added capacity.

15. The computer readable medium of claim 13, wherein step (c) includes:
  (i) performing physical layout for the reprogrammable structure; (ii) subsequently, performing physical layout for the rest of the circuit functionality.

16. The computer readable medium of claim 13, further including instructions for performing the step of:
  generating a programming pattern to be loaded into the reprogrammable structure.

17. The computer readable medium of claim 16, wherein:
  the step of generating a programming pattern includes generating a programming pattern in accordance with the functionality designated by the user to be reprogrammable and including that programming pattern as a default pattern built into the one-time configurable integrated circuit as modeled in step (b) and as part of the physical layout of step (c).

18. The computer readable medium of claim 16, further including:
  generating a second programming pattern to be loaded into the reprogrammable structure based on a second description received from the user for functionality to be implemented by the reprogrammable structure.

19. A method of creating a standard cell that includes a PLA, comprising:
  (a) receiving a description of circuit functionality specified by a user for implementation with the standard cell, the circuit functionality having a portion designated by the user to be implemented by a PLA;
  (b) automatically modeling a PLA using a cell library where the PLA is capable of implementing the designated portion of the circuit functionality;
  (c) automatically performing physical layout for the entire standard cell, including the PLA.

20. The method of claim 19, wherein step (b) includes automatically modeling said PLA with added capacity for use in the event of changed functionality to be implemented by the PLA.

21. The method of claim 19, wherein step (c) includes: (i) performing physical layout for the PLA; (ii) subsequently performing physical layout for the rest of the circuit functionality.

22. A method for creating a one-time configurable integrated circuit that includes a reprogrammable portion, comprising:
  (a) receiving a description of circuit functionality specified by a user for implementation with the one-time configurable integrated circuit, the circuit functionality having a portion designated by the user to be reprogrammable;
  (b) automatically modeling a reprogrammable structure that is capable of implementing the designated portion of the circuit functionality;
  (c) automatically performing physical layout for the reprogrammable structure including incorporation of a default programming pattern, wherein the default programming pattern is based on the circuit functionality designated by the user to be reprogrammable,
  wherein the physical layout for the reprogrammable structure is customized;
  (d) automatically performing physical layout for the rest of the circuit functionality specified by the user.

23. The method of claim 22, wherein steps (c) and (d) are performed simultaneously.

24. A method for creating a one-time configurable integrated circuit that includes a reprogrammable portion, comprising:
  (a) receiving a description of circuit functionality specified by a user for implementation with the one-time configurable integrated circuit, the circuit functionality having a first portion that identifies the logic design for the reprogrammable portion and a second portion that identifies the logic design for the one-time configurable portion of the integrated circuit;
  (b) automatically modeling a reprogrammable structure that is capable of implementing the first portion of the circuit functionality;
  (c) automatically performing physical layout for the entire one-time configurable integrated circuit, including both the reprogrammable structure as well as the rest of the circuit functionality specified by the user,
  wherein the physical layout for the reprogrammable structure is customized.

25. A method for creating a one-time configurable integrated circuit that includes a reprogrammable portion, comprising:
  (a) receiving a description of circuit functionality specified by a user for implementation with the one-time configurable integrated circuit, the circuit functionality having a portion designated by the user to be reprogrammable;
  (b) automatically modeling a reprogrammable structure to implement only the designated portion of the circuit functionality with an additional determined amount of capacity;
  (c) automatically performing physical layout for the entire one-time configurable integrated circuit, including both the reprogrammable structure as well as the rest of the circuit functionality specified by the user.

26. The method of claim 25, wherein the additional determined amount of capacity is zero.

27. The method of claim 25, wherein the additional determined amount of capacity is a fixed percentage.

* * * * *